(12) United States Patent
Perets et al.

(10) Patent No.: US 7,324,598 B2
(45) Date of Patent: Jan. 29, 2008

(54) APPARATUS AND METHOD TO REDUCE QUANTIZATION ERROR

(75) Inventors: Yoni Perets, Petach-Tikva (IL); Kobby Pick, Modiin (IL)

(73) Assignee: Intel Corporation, Santa Clara, CA (US)

( * ) Notice: Subject to any disclaimer, the term of this patent is extended or adjusted under 35 U.S.C. 154(b) by 926 days.

(21) Appl. No.: 10/195,783

(22) Filed: Jul. 15, 2002

(65) Prior Publication Data

US 2004/0008791 A1    Jan. 15, 2004

(51) Int. Cl.
*H04B 14/04* (2006.01)

(52) U.S. Cl. ........................ 375/243; 375/245

(58) Field of Classification Search ............... 375/243, 375/259, 260, 286, 287, 288, 292, 295, 296, 375/242, 244, 245, 254; 455/59; 327/100, 327/105, 106, 107; 708/100, 200, 270, 290, 708/440, 603
See application file for complete search history.

(56) References Cited

U.S. PATENT DOCUMENTS

| | | | | |
|---|---|---|---|---|
| 3,732,502 A | * | 5/1973 | Seidel | 330/149 |
| 4,649,421 A | * | 3/1987 | Kodama et al. | 348/263 |
| 4,746,902 A | * | 5/1988 | Tol et al. | 341/118 |
| 4,905,177 A | * | 2/1990 | Weaver et al. | 708/276 |
| 5,070,515 A | * | 12/1991 | Iwahashi et al. | 375/245 |
| 5,321,642 A | * | 6/1994 | Goldberg | 708/276 |
| 5,543,844 A | * | 8/1996 | Mita et al. | 375/240.2 |
| 5,548,286 A | * | 8/1996 | Craven | 341/126 |
| 5,644,229 A | * | 7/1997 | Dossel et al. | 324/247 |
| 5,815,334 A | * | 9/1998 | Chang | 360/53 |
| 6,269,166 B1 | * | 7/2001 | Matsuo et al. | 381/310 |
| 6,323,792 B1 | | 11/2001 | Regier | 341/118 |
| 6,333,649 B1 | * | 12/2001 | Dick et al. | 327/105 |
| 6,501,405 B1 | * | 12/2002 | Zhang et al. | 341/143 |
| 6,538,588 B1 | * | 3/2003 | Bazarjani | 341/143 |
| 6,567,831 B1 | * | 5/2003 | Loginov | 708/290 |
| 2002/0025004 A1 | * | 2/2002 | Aarts | 375/245 |
| 2002/0054354 A1 | * | 5/2002 | Fukao | 358/3.04 |
| 2003/0091090 A1 | * | 5/2003 | Schieferdecker et al. | 374/120 |

FOREIGN PATENT DOCUMENTS

| | | |
|---|---|---|
| EP | 0580101 A2 | 1/1994 |
| JP | 04-079419 | 3/1992 |
| JP | 06-113276 | 4/1994 |
| JP | 01-036406 | 2/2001 |

OTHER PUBLICATIONS

Jennifer Pearce, Taylor Series, 1996, http://web.archive.org/web/20010304212943/http://www.math.unh.edu/~jjp/taylor/taylor.html.*

Hwei Hsu, Analog and Digital Communications, 1993, McGraw-Hill, pp. 93-94.*

* cited by examiner

*Primary Examiner*—Chieh M. Fan
*Assistant Examiner*—Naheed Ejaz
(74) *Attorney, Agent, or Firm*—Schwegman, Lundberg & Woessner, P.A.

(57) ABSTRACT

An apparatus includes a quantizer to generate a quantized signal from an input signal and a function unit may be included to generate an output signal by applying a predetermined function to the quantized signal. The apparatus further may include a correction unit to compensate for distortion in the output signal.

22 Claims, 3 Drawing Sheets

APPARATUS AND METHOD TO REDUCE QUANTIZATION ERROR

BACKGROUND INFORMATION

In implementing or calculating a digital function in an electronic device or system, a predetermined number of bits may be used as the input for the function calculation. The greater the number of bits used as the input, the more accurate may be the output signal and the smaller the output error E; however, the complexity of the function calculation also increases with a greater number of input bits. If the number of input bits is reduced to reduce the complexity of the function calculation, the output error E will increase.

Implementing a digital function with a large number of input bits, such as a matrix inversion function or the like, requires complex calculation hardware and large memory capacity to deal with the large number of bits and can result in substantial consumption of current or power every time the function is performed or calculated. A software implementation of the digital function may also consume significant amounts of current or power in performing numerous instructions per second. Consumption of power may be critical in a battery operated digital device or system.

Accordingly, for the reason stated above, and for other reasons that will become apparent upon reading and understanding the present specification, there is a need for an apparatus and method that may use a reduced number of input bits without increasing the output error or quantization error, consume less power and permit the calculation hardware to be simpler and the memory capacity required to be smaller.

DESCRIPTION OF THE EMBODIMENTS

The following detailed description of embodiments refers to the accompanying drawings which illustrate specific embodiments of the invention. Other embodiments having different structures and operations do not depart from the scope of the present invention.

Figure 1:
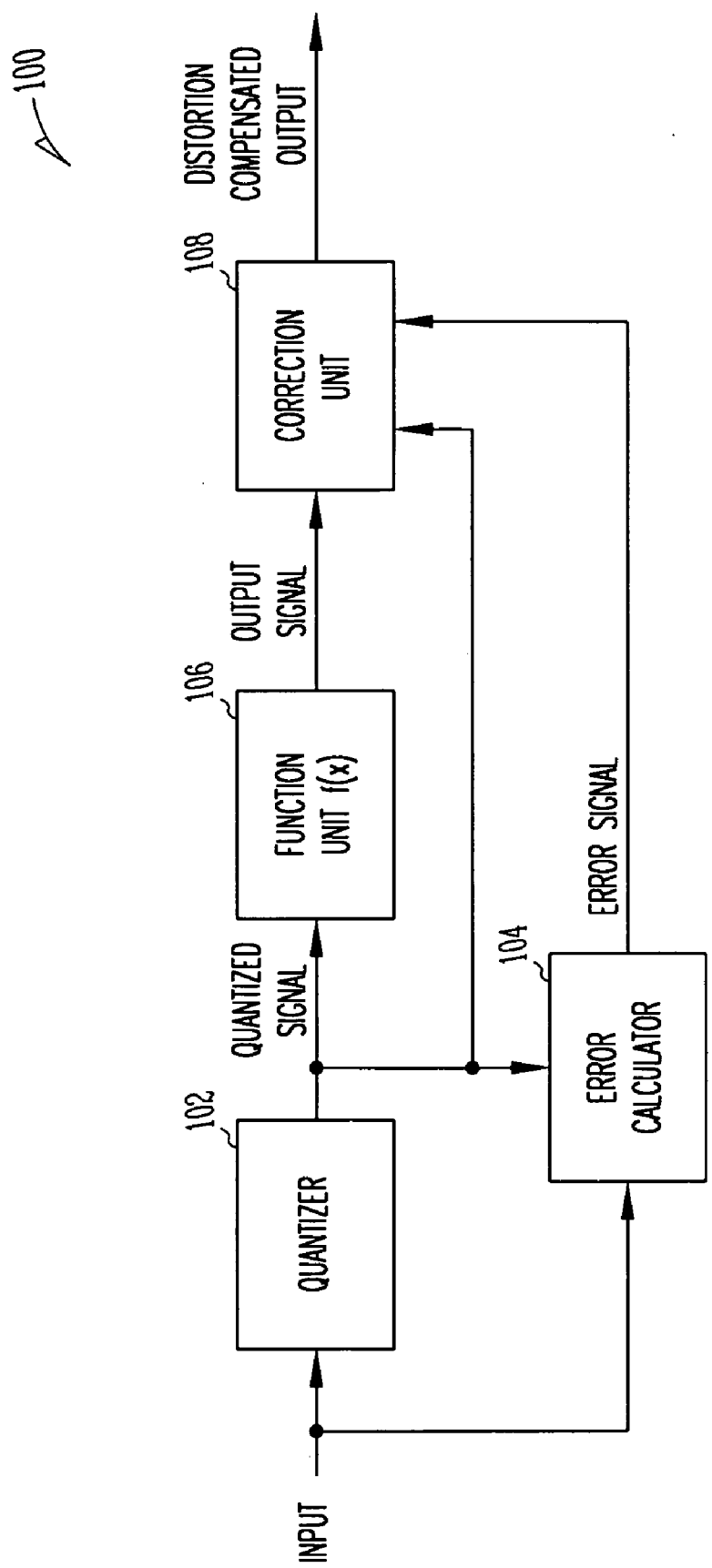
FIG. 1 is a block diagram of an apparatus to reduce quantization error in accordance with an embodiment of the present invention.

FIG. 1 is a block diagram of an apparatus 100 to reduce quantization error in accordance with an embodiment of the present invention. Apparatus 100 may include a quantizer 102 that may generate a quantized signal from an input signal. Quantizer 102 may represent the input signal by some finite number of bits. For example, a digital 16 bit input signal may be quantized to a 3 bit quantized signal. In the process of quantizing the bits, some distortion $\Delta$ may be introduced in the quantized signal. The input signal and the quantized signal may be applied to an error calculator 104. Error calculator 104 may determine a difference between the input signal and the quantized signal from the quantizer 102.

Error calculator 104 may generate an error signal in response to the distortion $\Delta$ or a difference between the input signal and the quantized signal. Accordingly, the error signal may correspond to $\Delta$.

Quantizer 102 may be coupled to a function unit 106. Function unit 106 may be adapted to generate an output signal by applying a predetermined function f(x) to the quantized signal. Function unit 106 may be any device or element to map an input signal to an output signal according to the predetermined function. Function unit 106 and error calculator 104 may be coupled to a correction unit 108. The quantized signal may also be coupled to the correction unit 108. Correction unit 108 may compensate for distortion in the output signal from function unit 106 in response to the error signal $\Delta$ to increase the accuracy of the output signal. Correction unit 108 may generate a distortion compensated output signal by calculating a Taylor series approximation of the output signal. The arbitrary or selected function f(x) may be represented by a Taylor series expansion around x=a:

$$f(a+\Delta)-f(a)=f'(a)\cdot\Delta/1!+f''(a)\cdot\Delta^2/2!+ \ldots +f^{(N)}(a)\cdot\Delta^N/N!+ \ldots \quad (1)$$

where $\Delta=x-a$, and $f^{(N)}(a)$ is the N'th order derivative of f(x) at x=a. Solving equation 1 for f(a), the output of the correction unit 108 is the output signal compensated for distortion $\Delta$ and may be a first order Taylor series approximation of the function f(x) at x=a:

$$f(a)\cong f(a+\Delta)-f'(a)\cdot\Delta. \quad (2)$$

Function unit 106 or correction unit 108 may generate a first derivative signal or term corresponding to f'(a) in equation 2 by applying a first derivative f'(x) of the predetermined function f(x) to the quantized signal for x=a. For increased accuracy, additional terms of the Taylor series may be included in equation 2:

$$f(a)\cong f(a+\Delta)-f'(a)\cdot\Delta-f''(a)\cdot\Delta^2/2!-(\Sigma_{N=3}f^{(N)}(a)\cdot(\Delta)^N/N!). \quad (3)$$

Function unit 106 or correction unit 108 may also be adapted to generate additional derivative signals or terms for the additional terms of the Taylor series. An additional derivative signal or term corresponds to a respective higher order derivative $f^{(N)}(a)$ of the predetermined function f(x) being applied to the quantized signal for x=a. While the additional terms increase the accuracy of the Taylor series approximation of the function f(x), the additional terms of the Taylor series also increase the complexity of apparatus 100.

As an example of operation of apparatus 100, an input signal represented by a matrix X may be applied to quantizer 102. The quantized signal may be represented by X+$\Delta$ where $\Delta$ is the distortion or quantization error introduced by the quantization process. Function unit 106 may apply a predetermined function that is an inverse of the matrix, $f(x)=X^{-1}$. Accordingly, function unit 106 may generate an output signal that is an inverse of the quantization signal, $(X+\Delta)^{-1}$. The Taylor series approximation for a distortion compensated output of the function $f(x)=X^{-1}$ generated by correction unit 108 may become:

$$X^{-1}\cong(X+\Delta)^{-1}-(X+\Delta)^{-1}\cdot\Delta\cdot(X+\Delta)^{-1}. \quad (4)$$

Apparatus 100 may simplify the function calculation by quantizing the input signal to reduce the number bits used in the predetermined function calculation in the function unit 106 and compensates for the quantization error by determining a Taylor series approximation of the predetermined function in correction unit 108. Apparatus 100 may be implemented in hardware or software.

Figure 2:
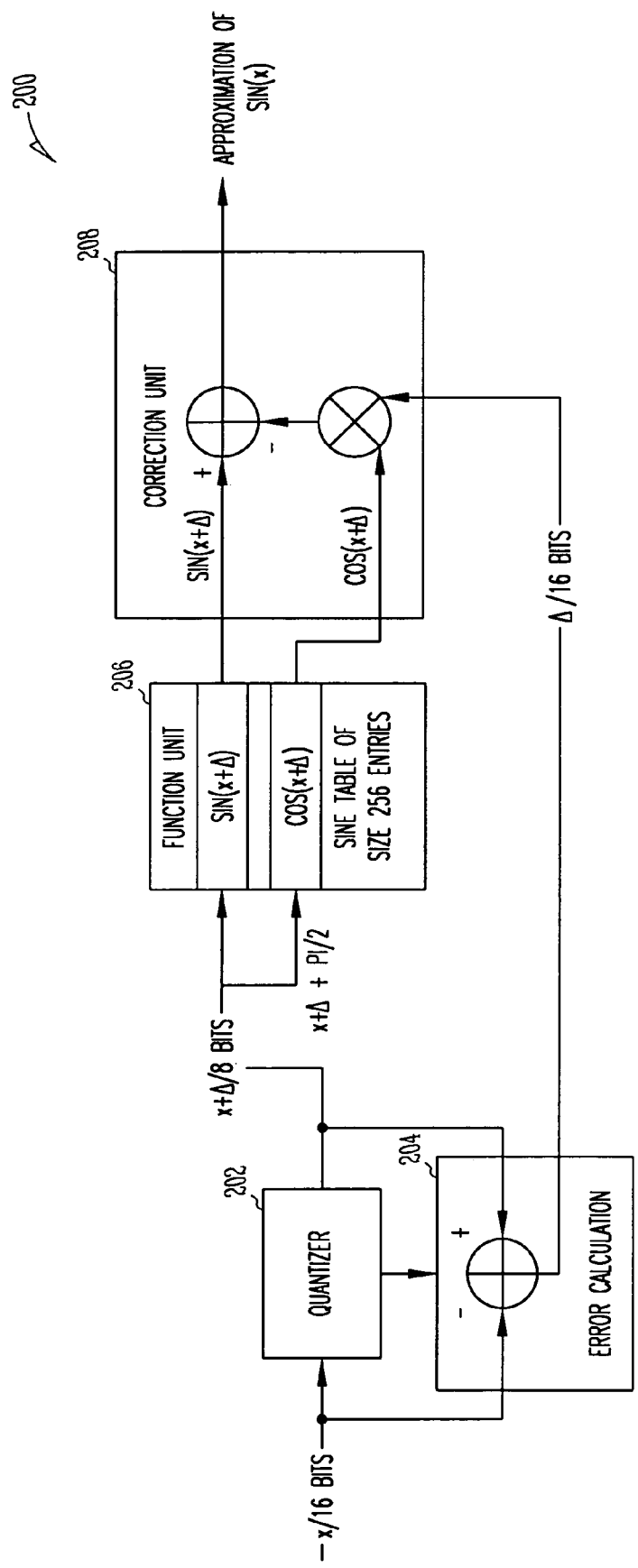
FIG. 2 is a block diagram of an apparatus to reduce quantization error in accordance with another embodiment of the present invention.

FIG. 2 is a block diagram of an apparatus 200 to reduce quantization error in accordance with another embodiment of the present invention. Apparatus 200 may include a quantizer 202 that may generate a quantized signal from an input signal X. In the example shown in FIG. 2, a 16 bit input signal may be quantized to an 8 bit quantized signal with some distortion, X+Δ. The input signal X and the quantized signal X+Δ may be applied to an error calculator 204. Error calculator 204 determines a difference between the input signal X and the quantized signal X+Δ and may generate an error signal that corresponds to the distortion Δ.

The quantized signal X+Δ may be applied to a function unit 206. The function unit 206 may be adapted to generate an output signal by applying a predetermined function f(X) to the quantized signal. In the embodiment shown in FIG. 2, the predetermined function f(X) may be the sine function. Accordingly, function unit 206 may generate an output signal that corresponds to sin (X+Δ). The function unit 206 may contain a sine table to generate the output signal sin (X+Δ). The sine table may contain 256 entries.

A quantized signal that is phase shifted by 90° may be generated from the quantized signal, X+Δ+Π/2 and may be applied to function unit 206 to provide the first derivative of the predetermined function sin (X) which is the cos (X). Thus, function unit 206 may generate a first derivative signal that is the first derivative of the predetermined function applied to the quantized signal or cos (X+Δ). The cos (X+Δ) may also be determined from the sine table.

The output signal sin (X+Δ) and the first derivative signal cos (X+Δ) from function unit 206 may be applied to a correction unit 208 along with the error signal Δ to generate a distortion compensated output signal that may be an approximation for the sin (X). Correction unit 208 may generate the distortion compensated output signal by calculating a Taylor series approximation of the output signal pursuant to equation 2 above and shown by equation 5:

$$\sin(X) \approx \sin(X+\Delta) - \cos(X+\Delta) \cdot \Delta. \quad (5)$$

Figure 3:
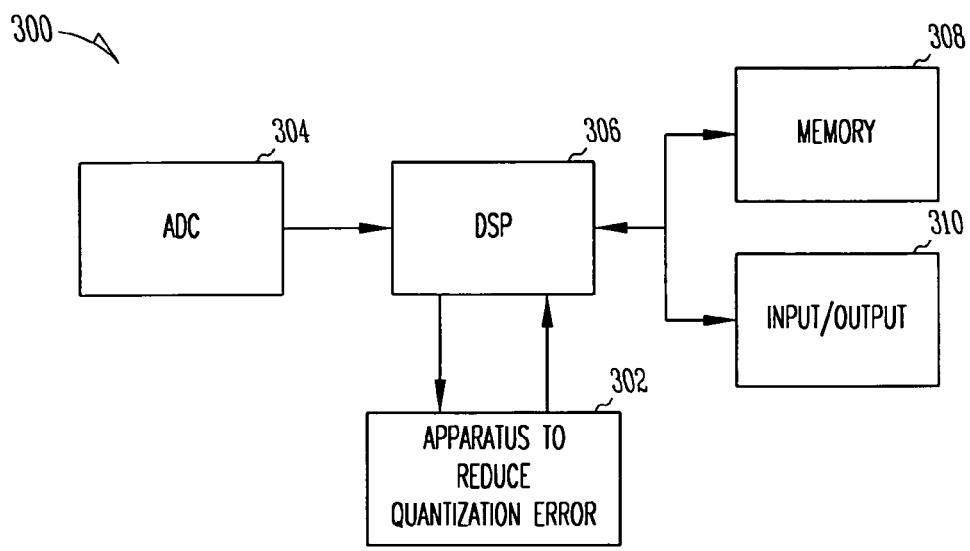
FIG. 3 is a block diagram of an electronic system including an apparatus to reduce quantization error in accordance with an embodiment of the present invention.

FIG. 3 is a block diagram of an electronic system 300 including an apparatus 302 to reduce quantization error in accordance with an embodiment of the present invention. Apparatus 302 may be substantially similar to the apparatuses 100 or 200 in FIGS. 1 and 2 respectively. Electronic system 300 may include an analog-to-digital converter 304 (ADC) to convert analog signals to digital signals. ADC 304 may be connected to a digital signal processor 306 (DSP) and DSP 306 may be connected to apparatus 302 to reduce quantization error. DSP 306 may represent a circuit to provide an input signal to apparatus 302 and that may also receive a distortion compensated output signal from apparatus 302. Apparatus 302 may quantize a digital input signal to reduce the number of bits, apply a predetermined function to the quantized signal, and generate a distortion compensated output signal similar to that described with respect to apparatuses 100 and 200 in FIGS. 1 and 2 respectively.

DSP 306 may be connected to a memory 308 to store information that may be retrieved and used or processed by DSP 306. DSP 306 may also be connected to an input/output interface 310 to facilitate the transfer of information to and from DSP 306. Electronic system 300 may be a subsystem of a larger device or system such as a communications device or system, computer system, industrial control system or the like.

Figure 4:
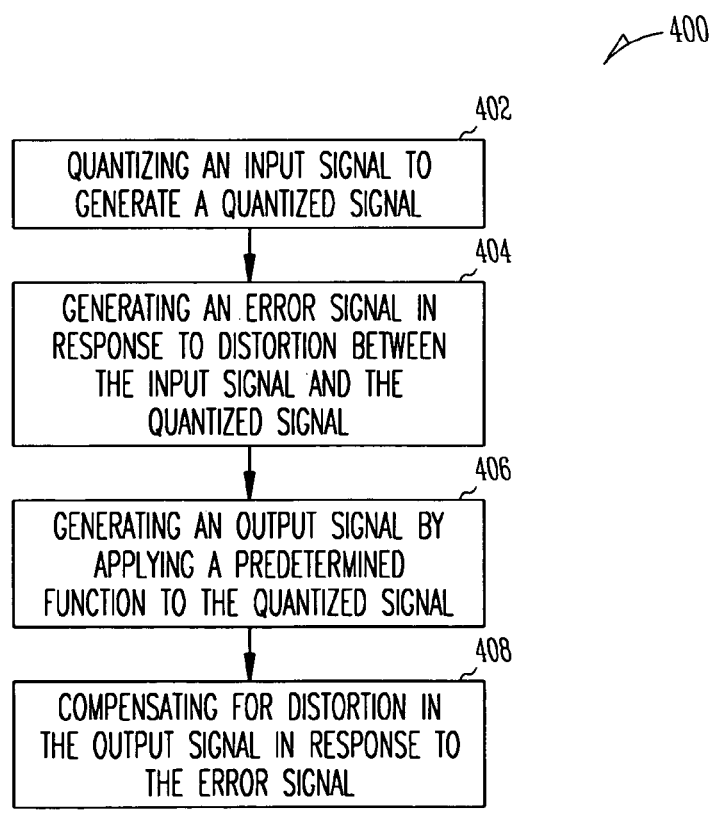
FIG. 4 is a flow chart of a method to reduce quantization error in accordance with an embodiment of the present invention.

FIG. 4 is a flow chart of a method 400 to reduce quantization error in accordance with an embodiment of the present invention or to reduce the number of bits used as an input for a predetermined function calculation while maintaining an output error substantially the same. In block 402, an input signal may be quantized to generate a quantized signal with a reduced number of bits compared to the input signal. In block 404, an error signal may be generated in response to distortion between the input signal and the quantized signal. An output signal may be generated in block 406 by applying a predetermined function to the quantized signal. The reduced number of bits of the quantized signal may reduce the complexity of calculating the predetermined function by reducing the number of operations or computations in calculating the predetermined function. In block 408, distortion in the output signal may be compensated in response to the error signal. The distortion or error in the output signal may in part be caused by calculating the predetermined function using the reduced number of bits of the quantized signal. Distortion in the output signal may be compensated by calculating a Taylor series approximation of the output signal. Accordingly, the apparatuses 100 and 200 may reduce the complexity of calculating the predetermined function by enabling a reduction in the number of bits used in the calculation while maintaining an output error substantially equal to that of using all of the bits of the original input signal.

The method 400 may be embodied in a computer-readable medium having computer-executable instructions for performing the method 400. The computer-readable medium may include any kind of computer memory, such as floppy disks, conventional hard disks, compact disc-read only memory (CD-ROM), flash ROMS, nonvolatile ROM, random access memory (RAM) or the like.

Although specific embodiments have been illustrated and described herein, those of ordinary skill in the art appreciate that any arrangement which is calculated to achieve the same purpose may be substituted for the specific embodiments shown. This application is intended to cover any adaptations or variations of the present invention. Therefore, this invention is limited only by the claims and the equivalents thereof.

What is claimed is:

1. An apparatus, comprising:
    a quantizer to generate a quantized signal from an input signal;
    a function unit to generate an output signal by applying a predetermined function to the quantized signal; and
    a correction unit to compensate for distortion in the output signal by generating a Taylor series approximation using the output signal and an error signal, wherein the error signal is a difference between the input signal and the quantized signal, and wherein the Taylor series approximation is an approximation of the predetermined function applied to the input signal.

2. The apparatus of claim 1, further comprising an error calculator to generate the error signal in response to distortion between the input signal and the quantized signal.

3. The apparatus of claim 1, where the correction generates a distortion compensated output signal by subtracting at least a first order term of a Taylor series approximation of the output signal from the output signal.

4. The apparatus of claim 1, wherein a selected number of higher order terms of a Taylor series approximation of the output signal are subtracted from the output signal in the correction unit to provide a predetermined increase in compensation for distortion in the output signal.

5. The apparatus of claim 1, wherein the function unit or the correction unit is adapted to generate at least one derivative term by applying a first derivative of the predetermined function to the quantized signal.

6. The apparatus of claim 5, wherein the correction unit compensates for distortion in the output signal by subtracting at least a product of the error signal and the at least one derivative term from the output signal.

7. The apparatus of claim 1, wherein the function unit or the correction unit is adapted to generate more than one derivative terms, the derivative terms being respectively generated by applying a respective higher order derivative of the predetermined function to the quantized signal.

8. The apparatus of claim 7, wherein the correction unit compensates for distortion in the output signal according to the equation:

$$f(\alpha) \approx f(\alpha+\Delta) - f'(\alpha) \cdot \Delta - f''(\alpha) \cdot \Delta^2/2! - (\Sigma_{N=2} f^{(N)}(\alpha) \cdot (\Delta)^N/N!),$$

wherein $\Delta$ corresponds to the error signal, f'(a) corresponds to the first order derivation of the predetermined function for a value "a" and $f^{(N)}(a)$ corresponds to an N'th order derivative of the predetermined function for the value "a."

9. A system, comprising:
a circuit to generate an input signal;
a quantizer to generate a quantized signal from the input signal, wherein the quantized signal has a number of bits reduced from a number of bits in the input signal;
an error calculator to generate an error signal in response to distortion between a sampled analog signal and the quantized signal;
a function unit to generate an output signal by applying a predetermined function to the quantized signal; and
a correction unit to generate a distortion compensated output signal using a Taylor series approximation calculated from the output signal and the error signal, wherein the function unit or the correction unit is adapted to generate at least one derivative signal by applying a first derivative of the predetermined function to the quantized signal, and wherein the correction unit compensates for distortion in the output signal by subtracting at least a product of the error signal and the at least one derivative signal from the output signal; and
one of a digital signal processor, central processing unit or storage device to receive the output signal compensated for distortion.

10. The system of claim 9, wherein the correction unit generates a distortion compensated output signal by calculating a Taylor series approximation of the predetermined function applied to the input signal.

11. The system of claim 9, wherein the correction unit generates a distortion compensated output signal by subtracting at least a first order term of a Taylor series approximation of the output signal from the output signal.

12. The system of claim 9, wherein a selected number of higher order terms of a Taylor series approximation of the output signal are subtracted from the output signal in the correction unit to provide a predetermined increase in compensation for distortion in the output signal.

13. A method, comprising:
quantizing an input signal to generate a quantized signal;
generating an output signal by applying a predetermined function to the quantized signal; and
compensating for distortion in the output signal by using the output signal and an error signal to generate a Taylor series approximation, wherein the error signal is a difference between the input signal and the quantized signal, and wherein the Taylor series approximation is an approximation of the predetermined function applied to the input signal.

14. The method of claim 13, wherein compensating for distortion in the output signal comprises subtracting at least a first order term of a Taylor series approximation of the output signal from the output signal.

15. The method of claim 13, further comprising generating at least one derivative term by applying a first derivative of the predetermined function to the quantized signal.

16. The method of claim 15, wherein compensating for distortion in the output signal comprises subtracting at least a product of an error signal and the at least one derivative term from the output signal.

17. A method, comprising:
generating an output signal by calculating a predetermined function using a quantized signal having a number of bits reduced from a number of bits in an input signal; and
compensating for distortion in the output signal caused by calculating the predetermined function with the reduced number of bits by using the output signal and an error signal to generate a Taylor series approximation of the predetermined function applied to the input signal, wherein the error signal is a difference between the input signal and the quantized signal.

18. The method of claim 17, wherein calculating the Taylor series approximation of the output signal comprises determining a difference between the quantized signal and an input signal.

19. The method of claim 17, wherein compensating for distortion in the output signal comprises subtracting at least a first order term of a Taylor series approximation of the output signal from the output signal.

20. A computer-readable medium having computer-executable instructions for performing a method comprising:
generating an output signal by calculating a predetermined function using a quantized signal having a number of bits reduced from a number of bits in an input signal; and
compensating for distortion in the output signal caused by calculating the predetermined function with the reduced number of bits by using the output signal and an error signal to generate a Taylor series approximation of the predetermined function applied to the input signal, wherein the error signal is a difference between the input signal and the quantized signal.

21. The computer-readable medium having computer-executable instructions for performing the method of claim 20, wherein calculating the Taylor series approximation of the output signal comprises determining a difference between the quantized signal and an input signal.

22. The computer-readable medium having computer-executable instructions for performing the method of claim 20, wherein compensating for distortion in the output signal comprises subtracting at least a first order term of a Taylor series approximation of the output signal from the output signal.

* * * * *

UNITED STATES PATENT AND TRADEMARK OFFICE
CERTIFICATE OF CORRECTION

PATENT NO. : 7,324,598 B2 Page 1 of 1
APPLICATION NO. : 10/195783
DATED : January 29, 2008
INVENTOR(S) : Perets et al.

It is certified that error appears in the above-identified patent and that said Letters Patent is hereby corrected as shown below:

In column 4, line 55, in Claim 3, after "correction" insert -- unit --.

In column 5, line 16, in Claim 8, after "wherein" delete "A" and insert -- Δ --, therefor.

Signed and Sealed this

Twenty-fourth Day of June, 2008

JON W. DUDAS
*Director of the United States Patent and Trademark Office*